US012426476B2

(12) United States Patent
Qin et al.

(10) Patent No.: US 12,426,476 B2
(45) Date of Patent: Sep. 23, 2025

(54) DISPLAY PANEL AND DISPLAY DEVICE

(71) Applicant: KunShan Go-Visionox Opto-Electronics Co., Ltd., Jiangsu (CN)

(72) Inventors: Xu Qin, Kunshan (CN); Miao Chang, Kunshan (CN); Lu Zhang, Kunshan (CN); Siming Hu, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 486 days.

(21) Appl. No.: 17/856,592

(22) Filed: Jul. 1, 2022

(65) Prior Publication Data

US 2022/0336545 A1 Oct. 20, 2022

Related U.S. Application Data

(63) Continuation of application No. PCT/CN2021/091112, filed on Apr. 29, 2021.

(30) Foreign Application Priority Data

Jul. 9, 2020 (CN) .......................... 202010658535.3

(51) Int. Cl.
*H10K 59/86* (2023.01)
*H10K 59/12* (2023.01)
(Continued)

(52) U.S. Cl.
CPC .............. *H10K 59/86* (2023.02); *H10K 59/12* (2023.02); *H10K 59/131* (2023.02);
(Continued)

(58) Field of Classification Search
CPC .................. G09G 3/2074; G09G 3/20; G09G 2300/0426; H10K 59/122; H10K 59/123;
(Continued)

(56) References Cited

U.S. PATENT DOCUMENTS

| | | |
|---|---|---|
| 2019/0122608 A1 | 4/2019 | Kang et al. |
| 2020/0098837 A1 | 3/2020 | Bian |

(Continued)

FOREIGN PATENT DOCUMENTS

| | | |
|---|---|---|
| CN | 1991545 B | 9/2012 |
| CN | 110148621 A | 8/2019 |

(Continued)

OTHER PUBLICATIONS

International Search Report mailed Jul. 26, 2021, in corresponding to International Application No. PCT/ CN2021/091112; 7 pages (with English Translation).

(Continued)

*Primary Examiner* — Mamadou L Diallo
(74) *Attorney, Agent, or Firm* — Maier & Maier, PLLC

(57) ABSTRACT

A display panel and a display device are disclosed. The display panel includes: a first region and a second region, a transmittance of the first region being greater than a transmittance of the second region; a light-emitting unit disposed in the first region, the light-emitting unit including a first unit and a second unit, the first unit and the second unit respectively including a plurality of pixels with a plurality of colors; a drive circuit disposed in the second region and connected to the light-emitting unit; and a transparent conducting wire, at least two pixels with a same color respectively in the first unit and the second unit of the light-emitting unit being connected by the transparent conducting wire.

18 Claims, 3 Drawing Sheets

(51) Int. Cl.
    *H10K 59/131* (2023.01)
    *H10K 59/35* (2023.01)
    *H10K 59/65* (2023.01)
    *H10K 77/10* (2023.01)
    *H10K 102/00* (2023.01)

(52) U.S. Cl.
    CPC ........... *H10K 59/353* (2023.02); *H10K 59/65* (2023.02); *H10K 77/111* (2023.02); *H10K 2102/00* (2023.02); *H10K 2102/311* (2023.02)

(58) Field of Classification Search
    CPC .... H10K 59/128; H10K 59/35; H10K 59/121; H10K 59/131; H10K 59/353; H10K 59/65; H10K 30/82; H10K 59/1213; H10K 59/1216; Y02E 10/549
    See application file for complete search history.

(56) References Cited

U.S. PATENT DOCUMENTS

| | | | | |
|---|---|---|---|---|
| 2021/0210581 A1* | 7/2021 | Ma | ................... | H10K 59/1213 |
| 2021/0327912 A1* | 10/2021 | Hu | ................... | H01L 27/1218 |
| 2022/0115572 A1* | 4/2022 | Yang | ................... | H01L 33/62 |

FOREIGN PATENT DOCUMENTS

| | | | | |
|---|---|---|---|---|
| CN | 110634930 A | 12/2019 | | |
| CN | 110767720 A | 2/2020 | | |
| CN | 110767835 A | 2/2020 | | |
| CN | 110783386 A | * 2/2020 | ........... | G09G 3/2074 |
| CN | 110890026 | 3/2020 | | |
| CN | 110943105 A | 3/2020 | | |
| CN | 210516181 U | 5/2020 | | |
| CN | 110767720 B | * 9/2020 | ........... | G09G 3/3208 |
| CN | 111834430 | 10/2020 | | |

OTHER PUBLICATIONS

First Office Action issued Jul. 20, 2021, in corresponding to Chinese Application No. 202010658535.3; 16 pages (with English Translation).

The Second Office Action issued Sep. 17, 2021, in corresponding to Chinese Application No. 202010658535.3; 20 pages (with English Translation).

Notification to Grant Patent Right for Invention issued Jan. 6, 2022, in corresponding to Chinese Application No. 202010658535.3; 6 pages (with English Translation).

* cited by examiner

DISPLAY PANEL AND DISPLAY DEVICE

CROSS REFERENCE TO RELATED APPLICATIONS

The present application is a continuation of International Patent Application No. PCT/CN2021/091112, filed on Apr. 29, 2021, the International Patent application claims priority to Chinese patent application No. 202010658535.3 entitled "DISPLAY PANEL AND DISPLAY DEVICE" and filed on Jul. 9, 2020. Each of which is incorporated by reference herein in its entirety.

TECHNICAL FIELD

Embodiments of the present disclosure relate to the field of display technology, and in particular to a display panel and a display device.

BACKGROUND

A display panel includes regions having varied transmittances. A camera is installed in a region having high transmittance to guarantee shooting performance of the camera. However, a pixel circuit is arranged in the region having high transmittance. As a result, the transmittance of the region is affected and a shooting result of the display panel is not well. Therefore, it is desired to provide a new display panel and display device to address the problem.

SUMMARY

Some embodiments of the present disclosure aim to provide a display panel and a display device, which can improve shooting effect of the display panel.

In order to address the technical problem, some embodiments of the present disclosure provide a display panel including:
- a first region and a second region, a transmittance of the first region being greater than a transmittance of the second region; and
- a light-emitting unit disposed in the first region, the light-emitting unit including a first unit and a second unit, the first unit and the second unit respectively including a plurality of pixels with a plurality of colors;
- a drive circuit disposed in the second region and connected to the light-emitting unit; and
- a transparent conducting wire, at least two pixels with a same color respectively in the first unit and the second unit of the light-emitting unit being connected by the transparent conducting wire.

Correspondingly, some embodiments of the present disclosure provide a display device including the display panel.

Compared with existing technologies, the embodiments of the present disclosure have the following advantages.

A transmittance of the first region is greater than a transmittance of the second region, and the light-emitting unit is disposed in the first region. Generally, because an external photosensitive element is correspondingly arranged under the first region, no drive circuit is provided on a side of the photosensitive element facing the display panel, which can effectively avoid the drive circuit to block external light into the photosensitive element. In this way, the transmittance is improved and optical performance of the photosensitive element can be ensured while full-screen display is achieved. By arranging the transparent conducting wire, and at least two pixels with the same color respectively in the first unit and the second unit of the light-emitting unit being connected by the transparent conducting wire, complexity of conducting wire connection between the pixels in the first region and the drive circuit in the second region is simplified. The transparent conducting wire between two pixels with the same color further improves the transmittance of the external light which transmits to the photosensitive element. Therefore, the transmittance of the first region is not affected by a conducting wire between the pixels, and shooting effect of the display panel is further improved.

DETAILED DESCRIPTION

Figure 1:
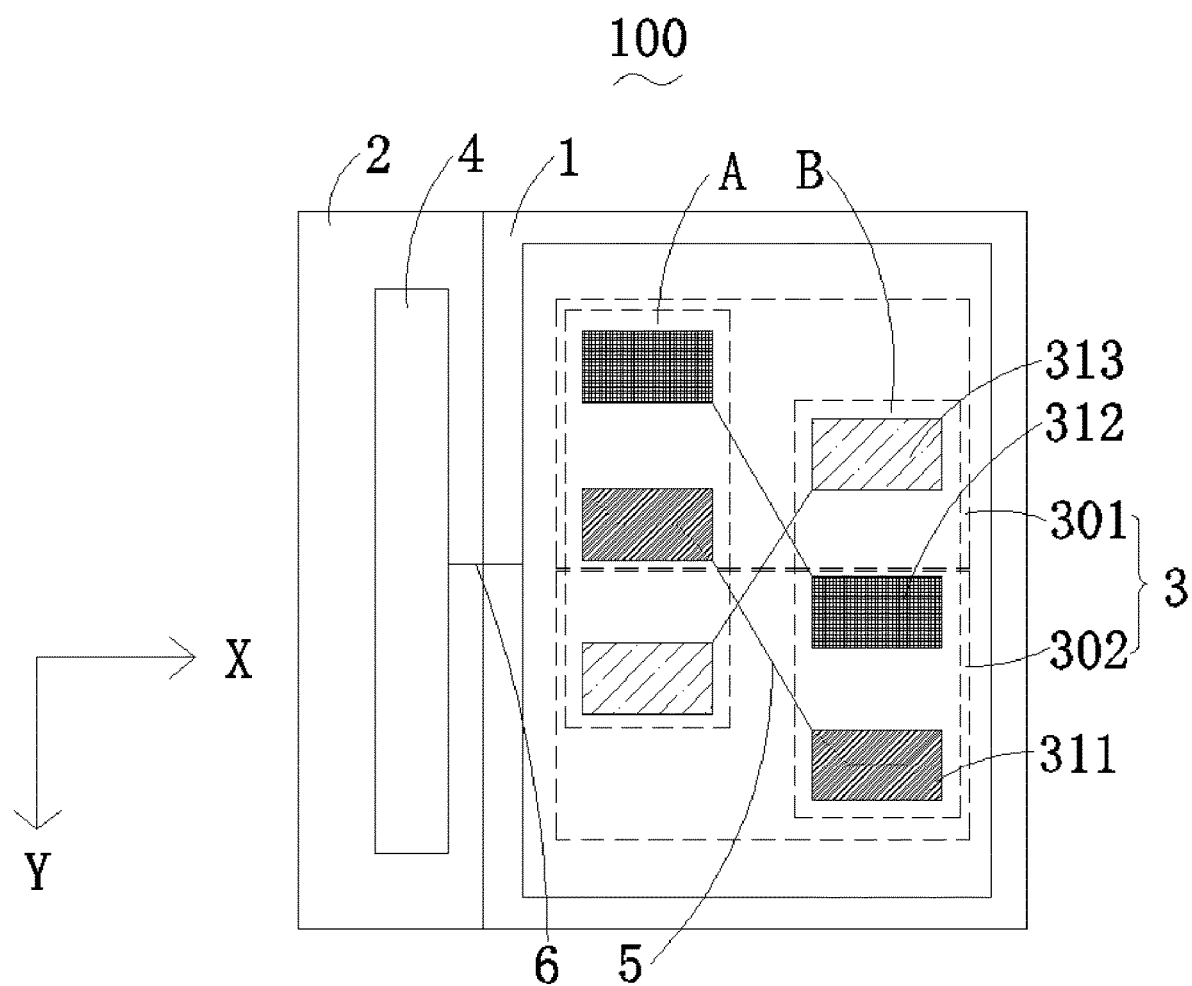
FIG. 1 is a structural schematic diagram of a display panel according to an embodiment of the present disclosure.

In one aspect, an embodiment of the present disclosure provides a display panel 100, a particular structure of the display panel 100 as shown in FIG. 1. The display panel 100 includes a first region 1 and a second region 2, wherein a transmittance of the first region 1 is greater than a transmittance of the second region 2. The display panel 100 further includes a light-emitting unit 3 disposed in the first region 1, the light-emitting unit 3 includes a first unit 301 and a second unit 302, the first unit 301 and the second unit 302 respectively includes a plurality of pixels with a plurality of colors. The display panel 100 further includes a drive circuit 4 disposed in the second region and connected to the light-emitting unit 3. The display panel 100 further includes a transparent conducting wire 5, at least two pixels with a same color respectively in the first unit 301 and the second unit 302 of the light-emitting unit 3 are connected by the transparent conducting wire 5.

In this embodiment, compared with existing technologies, the transmittance of the first region 1 is greater than the transmittance of the second region 2, and the light-emitting unit 3 is disposed in the first region 1. Generally, the first region 1 is arranged as corresponding to an external photosensitive element. Therefore, no drive circuit 4 is provided on a side of the photosensitive element facing the display panel 100, which can effectively avoid the drive circuit 4 to block external light into the photosensitive element. In this way, the transmittance is improved and optical performance of the photosensitive element can be ensured. By arranging the transparent conducting wire 5, and at least two pixels with the same color respectively in the first unit 301 and the second unit 302 of the light-emitting unit 3 are connected by the transparent conducting wire 5, complexity of conducting wire connection between the pixels in the first region and the drive circuit of the second region is simplified. The transparent conducting wire between two pixels with the same color will not block external light from entering the photosensitive element. Therefore, the transmittance of the first region 1 is further improved, and a shooting result of the display panel 100 is further improved.

In this embodiment, colors of the pixels in the first unit 301 is the same as colors of the pixels in the second unit 302, and the number of the pixel for each color in the first unit is one, the number of the pixel for each color in the second unit is one.

In this embodiment, the first unit 301 and the second unit 302 are arranged as adjacent to each other.

In this embodiment, the pixels include a first pixel 311 having a first color, a second pixel 312 having a second color, and a third pixel 313 having a third color. The light-emitting unit 3 includes the first unit 301 and the second unit 302. Herein, the first unit 301 and the second unit 302 each include a first pixel 311, a second pixel 312 and a third pixel 313. The first pixel 311 and the second pixel 312 which are in the first unit 301 and the third pixel 313 in the second unit 302 adjacent to the first unit 301 are sequentially arranged along a second direction Y to form a first structure A. The first pixel 311 and the second pixel 312 which are in the second unit 302 and the third pixel 313 in the first unit 301 adjacent to the second unit 302 are sequentially arranged along the second direction Y to form a second structure B. The first structure A and the second structure B are sequentially arranged in a first direction X, herein the first direction X is perpendicular to the second direction Y.

In this embodiment, the first color, the second color and the third color are not particularly defined, as long as it is ensured that the first color, the second color and the third color include red, green and blue.

In the display panel 100 shown in FIG. 1, the first direction X is a row direction, while the second direction Y is a column direction. The first direction X and the second direction Y are not particularly defined practically, as long as it is ensured that the first direction X and the second direction Y are perpendicular to each other. In addition, the display panel 100 shown in FIG. 1 includes a first structure A and a second structure B. In practice, the number of the first structure A and the second structure B are not particularly defined. For example, the first structure A and the second structure B may be arranged alternately in the first direction X.

Figure 2:
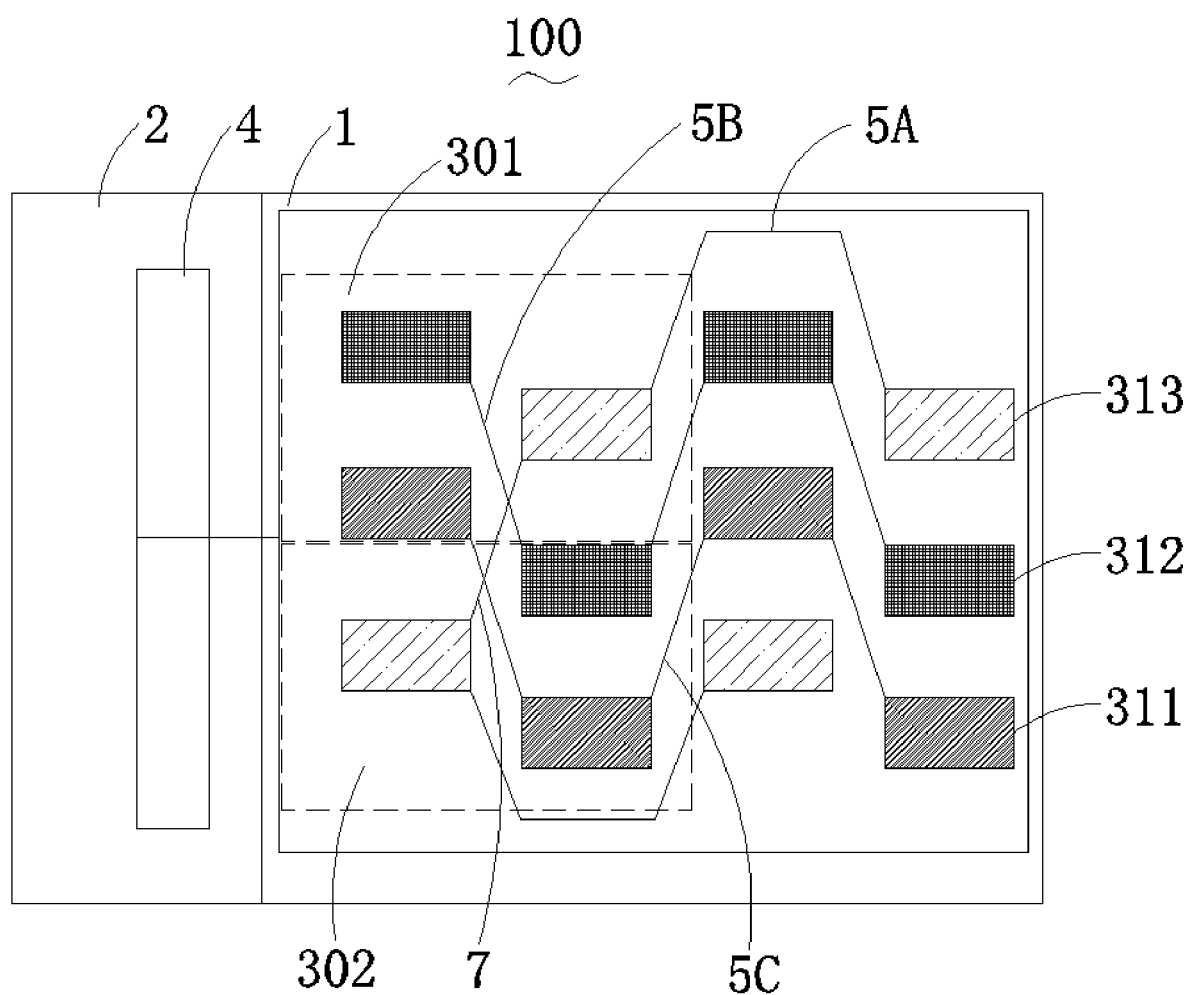
FIG. 2 is another structural schematic diagram of a display panel according to an embodiment of the present disclosure.

Referring to FIG. 2, it shows another structural schematic diagram of a display panel according to an embodiment of the present disclosure. The light-emitting unit 3 includes a plurality of first unit 301 and a plurality of second unit 302. The plurality of first unit 301 are sequentially arranged in the first direction X, the plurality of second unit 302 are sequentially arranged in the first direction X, and the first unit 301 and the second unit 302 are sequentially arranged in the second direction Y. Specifically, the light-emitting unit 3 shown in FIG. 2 includes two first units 301 and two second units 302. If the light-emitting unit 3 including a large number of the first unit 301 and the second unit 302, which may result in that a single light-emitting unit 3 takes too much area. An area of the first region 1 is fixed, such that there is a small number of light-emitting units 3 within a unit area of the first region 1, thereby resulting in a poor display effect in the first region 1. If the light-emitting unit 3 includes a small number of the first unit 301 and the second unit 302, which may result in too many light-emitting units 3 in the first region 1. Because the light-emitting units 3 are connected to the drive circuit 4 in a one-to-one correspondence, there would be too many drive circuits 4 within the second region 2, which will lead to poor display effect in the second region 2. By arranging the first units 301 and second units 302 with a density as shown in FIG. 2, display effect of both the first region 1 and the second region 2 can be ensured simultaneously. It shall be noted that by arranging the light-emitting units 3 with a pixel arrangement as such, numbers of conducting wires connecting pixels within the light-emitting units 3 are minimized. Therefore, a wiring of the first region is simplified, and a preparation process for the display panel 100 is simplified.

In addition, the first pixel 311 of the first unit 301 and the first pixel 311 of the second unit 302 adjacent to the first unit 301 are connected through the transparent conducting wire 5C. In this way, conducting wire between adjacent first pixels 311 would not block external light from entering the photosensitive element. Therefore, the transmittance of the first region 1 would not be affected by the conducting wire between the adjacent first pixels 311. Thus, shooting effect of the display panel is further improved.

Preferably, the second pixel 312 of the first unit 301 and second pixel 312 of the second unit 302 adjacent to the first unit 301 are connected through transparent conducting wire 5B. In this way, conducting wire between adjacent second pixels 312 would not block external light from entering the photosensitive element. Therefore, the transmittance of the first region 1 would not be affected by the conducting wire between the adjacent second pixels 312. Thus, shooting effect of the display panel is further improved.

It shall be noted that the transparent conducting wire 5 in this embodiment is a single-layer structure, which achieves electrical connection between pixels and may simplify the preparation process. The display panel 100 further includes a metal conducting wire 7. A projection of the metal conducting wire 7 in a thickness direction perpendicular to the display panel 100 overlaps with a projection of at least one transparent conducting wire 5 in the thickness direction perpendicular to the display panel 100. Because the transparent conducting wire 5 and the metal conducting wire 7 are of different materials, the transparent conducting wire 5 and the metal conducting wire 7 are arranged in different layers (i.e., there is an insulation layer between the transparent conducting wire 5 and the metal conducting wire 7) during preparation for the display panel. In this way, a signal crosstalk generated by crossed conducting wires in the light-emitting unit can be avoided.

Preferably, a metal layer (not shown in the drawings) is arranged in the second region 2 of the display panel 100. The metal layer includes a gate electrode, a gate wiring, a scanning signal wire and an electromagnetic (EM) circuit. A material of the metal layer includes metal Mo. The metal conducting wire 7 is arranged in the same layer as the metal layer. With a structure as such, for preparation of the display panel 100, the metal conducting wire 7 may be prepared together with the metal layer. Therefore, it is unnecessary to prepare the metal conducting wire 7 with an extra process, and the process for preparing for the display panel 100 is simplified. In this embodiment, an external photosensitive element is generally arranged below the first region 1. The second region 2 is a transition region surrounding the first region 1. The display panel further includes a main display region adjacent to the second region 2. Alternatively, the second region 2 is a main display region surrounding the first region 1. A light-emitting unit is arranged in the second region.

By arranging connecting wire between some pixels in the first region as single-layer transparent conducting wire, a transmittance is improved and a preparation process is simplified. Connecting wire between other pixels in the first region is arranged as metal conducting wire that is in the same layer as the metal layer in the second region. Therefore, there is no need to separately prepare the metal conducting wire and this is advantageous for being more efficient.

In an applicable embodiment, the third pixel 313 of the first unit 301 is connected with the third pixel 313 of another first unit 301 adjacent to the first unit 301 through transparent conducting wire 5A. The third pixel 313 of the second unit 302 is connected with the third pixel 313 of another second unit 302 adjacent to the second unit 302 through transparent conducting wire 5A. The third pixel 313 of the first unit 301 close to the drive circuit 4 is connected with the third pixel 313 of the second unit 302 adjacent to the first unit 301 through metal conducting wire 7. It is easy to notice that the conducting wire between the third pixel 313 of the first unit 301 close to the drive circuit 4 and the third pixel 313 of the second unit 302 adjacent to the first unit 301 would cross a wire between adjacent first pixels 311 and a wire between adjacent second pixels 312. Due to the transparent conducting wire 5A is a single-layer structure, in order to prevent crossed conducting wire from generating signal crosstalk, the third pixel 313 of the first unit 301 close to the drive circuit 4 and the third pixel 313 of the second unit 302 adjacent to the first unit 301 are connected through a metal conducting wire 7. This can improve reliability of the display panel 100.

Figure 3:
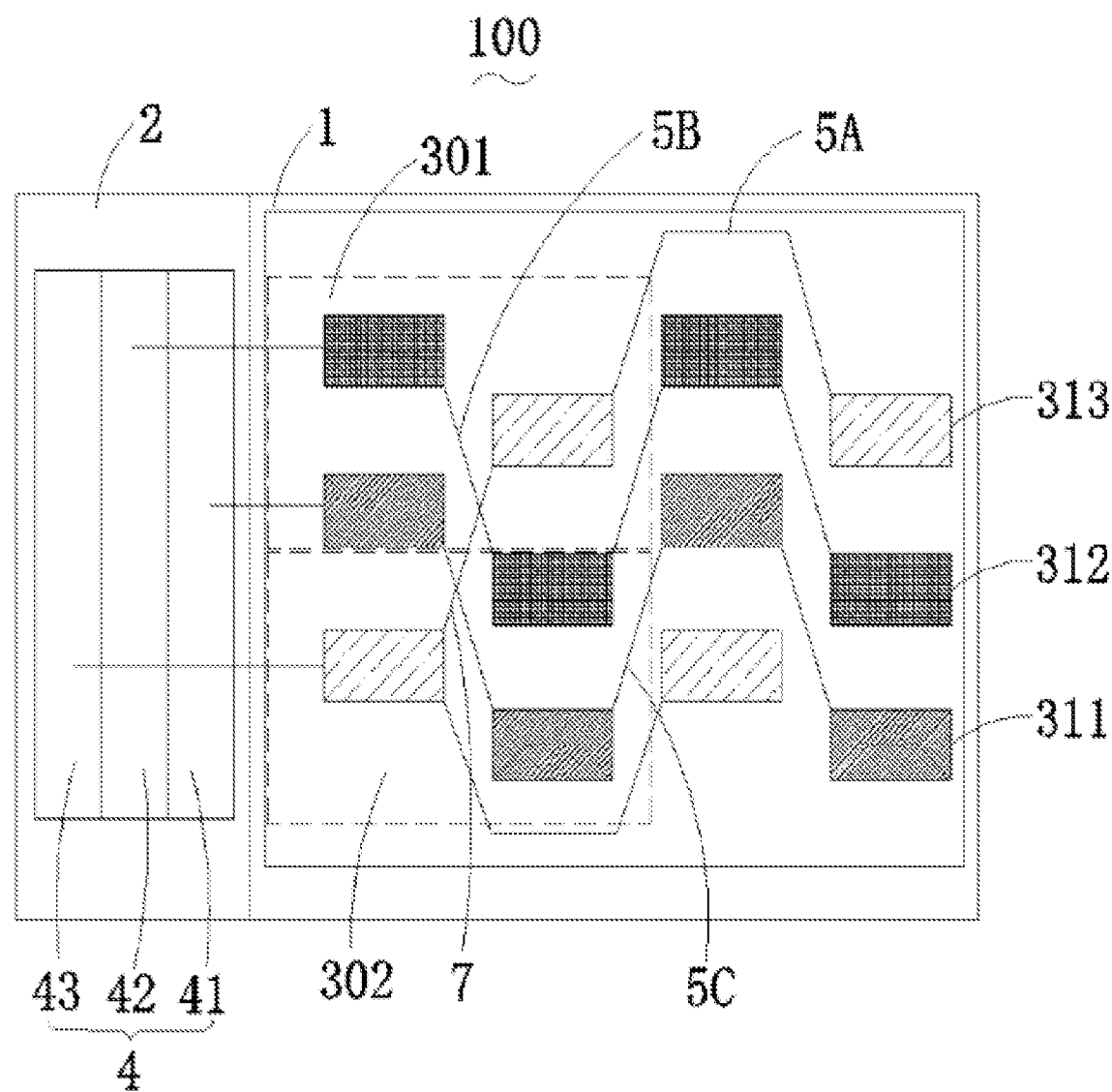
FIG. 3 is still another structural schematic diagram of a display panel according to an embodiment of the present disclosure.

Referring to FIG. 3, it shows still another structural schematic diagram of a display panel according to an embodiment of the present disclosure. The drive circuit 4 includes a first pixel circuit 41, a second pixel circuit 42 and a third pixel circuit 43. The first pixel 311 of the first unit 301 close to the drive circuit 4 is connected with the first pixel circuit 41. The second pixel 312 of the first unit 301 close to the drive circuit 4 is connected with the second pixel circuit 42. The third pixel 313 of the second unit 302 close to the drive circuit 4 is connected with the third pixel circuit 43. That is, one pixel circuit correspondingly connects the pixels with one color. In the light-emitting unit 3 shown in FIG. 3, the first pixel 311 is taken as an example. The number of the first pixel 311 is four, and the four first pixels 311 are connected through three of the transparent conducting wires 5. The first pixel circuit 41 is connected with the first pixel 311 closest to the drive circuit 4 through a wiring 6. That is, one first pixel circuit 41 controls four first pixels 311 in one light-emitting unit 3 to emit light synchronously or not to emit light synchronously. In this way, complexity of wiring of the first region can be simplified and a transmittance can also be ensured.

Specifically, the first pixel 311 and the first pixel circuit 41 are connected through a transparent conducting wire 6, the second pixel 312 and the second pixel circuit 42 are connected through a transparent conducting wire 6, and the third pixel 313 and the third pixel circuit 43 are connected through a transparent conducting wire 6. Herein the transparent conducting wire 6 is a single-layer structure. In this way, the transparent conducting wire 6 would not block external light from entering the photosensitive element. Therefore, the transmittance of the first region 1 would not be affected by the transparent conducting wire 6. Thus, shooting effect of the display panel 100 is further improved. In this embodiment, the drive circuit 4 is a thin film transistor (TFT) layer. The TFT layer comprises an active layer, a gate insulating layer, a gate electrode, an interlayer insulating layer, a source electrode and a drain electrode. Herein, the active layer is arranged on a flexible substrate. The gate insulating layer is arranged on the active layer, the gate electrode is arranged on the gate insulating layer, and the interlayer insulating layer is arranged on the gate electrode. One end of the source electrode is connected with one end of the drain electrode through the active layer. Another end of the source electrode and another end of the drain electrode respectively pass through the gate insulating layer and the interlayer insulating layer in order to extend to a planarization layer. A hole is provided in the planarization layer. The transparent conducting wire 6 is connected to the source electrode or the drain electrode through the hole (the electrode to be connected may be selected based on whether TFT is of an N-type or a P type).

In practice, the flexible substrate may be formed by such materials as imide (PI), polycarbonate (PC), polyethersulfone (PES), polyethylene terephthalate (PET), polyethylene naphthalate (PEN), polyarylate (PAR) and glass fiber reinforced plastic (FRP). The flexible substrate may be transparent, semi-transparent or opaque to provide support for formation of various films disposed thereon.

The active layer may be indium gallium zincoxide (IGZO). The gate insulating layer may be an inorganic layer formed by silicon oxide, silicon nitride or metal oxide. The gate insulating layer may be a single-layer or multi-layer structure. The gate electrode may be a single-layer or multi-layer structure formed by gold (Au), silver (Ag), copper (Cu), nickel (Ni), platinum (Pt), palladium (Pd), aluminum (Al), molybdenum (Mo) or chromium (Cr) and so on, or may be a layer structure formed by alloys such as aluminum (Al) neodymium (Nd) alloy and molybdenum (Mo) tungsten (W) alloy. The interlayer insulating layer may be formed by insulating inorganic materials such as silicon oxide or silicon nitride. The interlayer insulating layer may be a single-layer or multi-layer structure.

In an embodiment, materials for the transparent conducting wire 5 and transparent conducting wire 6 may include at least one of indium tin oxide, indium zinc oxide, silver-doped indium tin oxide and silver-doped indium zinc oxide. In this way, a light transmittance of transparent conducting materials is better. When the material of the transparent conducting wire is silver-doped indium tin oxide or silver-doped indium zinc oxide, resistance may be reduced while high transmittance is guaranteed. In this embodiment, the material of the transparent conducting wire is not particularly defined. The transparent conducting wire 5 may be of other material having high transmittance.

It shall be noted that the drive circuit 4 in the second region 2 connecting the pixels in the first region is formed together with the drive circuit in the main display region. That is, a density of the drive circuit 4 in the second region 2 is the same as a density of the drive circuit in the main display region. However, the drive circuit 4 in the second region 2 is further responsible for light-emitting of the light-emitting unit 3 in the first region 1. Consequently, in a case where drive voltages are equal, luminance of the second region 2 (and the first region 1) differs from the luminance of the main display region. It is known based on the above analysis that in response to a desire that a luminance of a display screen is a target value, luminance of the second region 2 (and the first region 1) and luminance of a main screen has to be compensated separately.

In this embodiment, pixel luminance collection may be performed on a white display of the display panel 100. In this way, real optical data of all sub-pixels on the white display are obtained, so that the obtained real optical data of all the sub-pixels are luminance data of the sub-pixels of varied colors in the white display (all sub-pixels emit light), so that correctness of data collection is guaranteed. Then compensated optical data of the sub-pixels are obtained according to the real optical data. Since the compensated optical data are luminance data that have to be compensated to the sub-pixels on the white display. Therefore, by luminance adjustment on the white display through the compensated optical data, luminance data that have to be compensated to the white display is compensated. In this way, after the luminance adjustment, the while display displays even luminance. There is no color deviation to the white display, and evenness of display of image is improved.

In another aspect, the present disclosure provides a display device including the display panel.

Herein, the display panel may be a flexible organic light emitting display panel or a non-flexible organic light emitting display panel. A light-emitting mode of the organic light emitting display panel may be top light emitting, bottom light emitting or double-side light emitting.

The display panel may further be encapsulated in the display device which may be applied to a smart wearable device (for example, a smart bracelet and a smart watch), or may be applied to a device such as a smart phone, a tablet or a display.

Those skilled in the art should appreciate that the aforementioned embodiments are specific embodiments for implementing the present invention. In practice, however, many changes can be made in the forms and details of the specific embodiments without departing from the spirit and scope of the invention. Any one skilled in the art may perform change and modification on the specification without departing from the spirit and scope of the invention. Therefore, the protection scope of the present disclosure shall be subject to the scope defined by the claims.

What is claimed is:

1. A display panel comprising:
   a first region, and
   a second region, wherein a transmittance of the first region is greater than a transmittance of the second region, a light-emitting unit is disposed in the first region, and comprises a first unit and a second unit, the first unit and the second unit-respectively comprise a plurality of pixels with a plurality of colors, a drive circuit is disposed in the second region and connected to the light-emitting unit, a metal conducting wire is disposed in the first region, and a transparent conducting wire is configured to connect, at least two pixels with a same color in the first unit of the light-emitting unit and the second unit of the light-emitting unit.

2. The display panel according to claim 1, wherein colors of the pixels in the first unit are the same as colors of the pixels in the second unit, the number of the pixels for each color in the first unit is one, and the number of the pixels for each color in the second unit is one.

3. The display panel according to claim 1, wherein the first unit is arranged adjacent to the second unit.

4. The display panel according to claim 1, wherein the transparent conducting wire is a single-layer structure, and a projection of the metal conducting wire in a thickness direction perpendicular to the display panel overlaps with a projection of the transparent conducting wire in the thickness direction perpendicular to the display panel.

5. The display panel according to claim 4, wherein the metal conducting wire is arranged in the same layer as the metal layer.

6. The display panel according to claim 2, wherein the pixels comprise:
   at least one first pixel having a first color,
   at least one second pixel having a second color, and
   at least one third pixel having a third color, wherein the first unit and the second unit each comprise the at least one first pixel, the at least one second pixel and the at least one third pixel, the at least one first pixel and the at least one second pixel in the first unit and the at least one third pixel in the second unit are sequentially arranged along a second direction to form a first structure, the at least one first pixel and the at least one second pixel in the second unit and the at least one third pixel in the first unit are sequentially arranged along the second direction to form a second structure, the first structure and the second structure are sequentially arranged along a first direction, and the first direction is perpendicular to the second direction.

7. The display panel according to claim 6, wherein the first unit comprises a plurality of first units, and the second unit comprises a plurality of second units; the plurality of first units is sequentially arranged in the first direction, the plurality of second units is sequentially arranged in the first direction, and the first unit and the second unit are sequentially arranged in the second direction.

8. The display panel according to claim 6, wherein the at least one first pixel of the first unit is connected with the at least one first pixel of the second unit through the transparent conducting wire, the at least one second pixel of the first unit is connected with the at least one second pixel of the second unit through the transparent conducting wire, the at least one third pixels of two adjacent first units are connected through the transparent conducting wire, the at least one third pixels of two adjacent second units are connected through the transparent conducting wire, and the at least one third pixel of the first unit close to the drive circuit is connected with the at least one third pixel of the second unit adjacent to the first unit through the metal conducting wire.

9. The display panel according to claim 6, wherein the drive circuit comprises:
   a first pixel circuit,
   a second pixel circuit, and
   a third pixel circuit, wherein; the at least one first pixel of the first unit close to the drive circuit is connected with the first pixel circuit, the at least one second pixel of the first unit close to the drive circuit is connected with the second pixel circuit, and the at least one third pixel of the second unit close to the drive circuit is connected with the third pixel circuit.

10. The display panel according to claim 9, wherein the at least one first pixel comprises four first pixels, the four first pixels are connected by three of the transparent conducting wires, and the first pixel circuit is connected with a first pixel of the four first pixels closest to the drive circuit through a wiring.

11. The display panel according to claim 9, wherein the at least one first pixel and the first pixel circuit are connected through the transparent conducting wire, the at least one second pixel and the second pixel circuit are connected through the transparent conducting wire, and the at least one third pixel and the third pixel circuit are connected through the transparent conducting wire.

12. The display panel according to claim 1, wherein a material of the transparent conducting wire comprises at least one of indium tin oxide, indium zinc oxide, silver-doped indium tin oxide and silver-doped indium zinc oxide.

13. The display panel according to claim 1, wherein the drive circuit is a thin film transistor layer.

14. The display panel according to claim 13, wherein the thin film transistor layer comprises an active layer, a gate insulating layer, a gate electrode, an interlayer insulating layer, a source electrode, and a drain electrode, and the display panel further comprises:
   a flexible substrate, wherein the active layer is arranged on the flexible substrate, the gate insulating layer is arranged on the active layer, the gate electrode is arranged on the gate insulating layer, and the interlayer insulating layer is arranged on the gate electrode.

15. The display panel according to claim 14, wherein a material of the flexible substrate comprises polycarbonate.

16. The display panel according to claim 14, wherein the gate insulating layer is a single-layer structure.

17. A display device, comprising the display panel according to claim 1.

18. The display device according to claim 17, wherein the display panel is a flexible organic light emitting display panel or a non-flexible organic light emitting display panel.

* * * * *